United States Patent
Moon

(10) Patent No.: US 8,981,477 B2
(45) Date of Patent: Mar. 17, 2015

(54) LATERALLY DIFFUSED METAL OXIDE SEMICONDUCTOR

(71) Applicant: Dongbu Hitek Co., Ltd., Seoul (KR)

(72) Inventor: Nam Chil Moon, Bucheon-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 0 days.

(21) Appl. No.: 13/833,210

(22) Filed: Mar. 15, 2013

(65) Prior Publication Data

US 2014/0264587 A1  Sep. 18, 2014

(30) Foreign Application Priority Data

Mar. 12, 2013 (KR) .................. 10-2013-0026150

(51) Int. Cl.
| | | |
|---|---|---|
| H01L 29/76 | (2006.01) |
| H01L 29/74 | (2006.01) |
| H01L 31/062 | (2012.01) |
| H01L 31/113 | (2006.01) |
| H01L 31/119 | (2006.01) |
| H01L 23/58 | (2006.01) |
| H01L 29/78 | (2006.01) |
| H01L 29/66 | (2006.01) |

(52) U.S. Cl.
CPC ...... H01L 29/7816 (2013.01); H01L 29/66681 (2013.01)
USPC ........... 257/343; 257/335; 257/341; 257/401; 257/492; 257/E29.066; 257/E29.152; 257/E29.187; 257/E29.256; 257/E29.261

(58) Field of Classification Search
USPC .................. 257/335, 341, 401, 492, E29.066, 257/E29.152, E29.187, E29.256, E29.261, 257/343
See application file for complete search history.

(56) References Cited

U.S. PATENT DOCUMENTS

| | | | | |
|---|---|---|---|---|
| 4,435,225 A | * | 3/1984 | Shideler et al. | 438/339 |
| 5,411,901 A | * | 5/1995 | Grabowski et al. | 438/283 |
| 6,087,232 A | * | 7/2000 | Kim et al. | 438/289 |
| 6,211,552 B1 | * | 4/2001 | Efland et al. | 257/343 |
| 6,424,005 B1 | * | 7/2002 | Tsai et al. | 257/335 |
| 6,475,870 B1 | * | 11/2002 | Huang et al. | 438/316 |
| 6,773,997 B2 | * | 8/2004 | Imam et al. | 438/286 |

(Continued)

FOREIGN PATENT DOCUMENTS

| | | |
|---|---|---|
| JP | H08255913 A | 10/1996 |
| KR | 10-1998-0054327 | 9/1998 |
| KR | 10-2001-0001608 A | 1/2001 |

OTHER PUBLICATIONS

Office Action dated Feb. 17, 2014 in Korean Application No. 10-2013-0026150.

(Continued)

*Primary Examiner* — Ida M Soward
(74) *Attorney, Agent, or Firm* — Saliwanchik, Lloyd & Eisenschenk

(57) ABSTRACT

A laterally-diffused metal oxide semiconductor (LDMOS) device and method of manufacturing the same are provided. The LDMOS device can include a drift region, a source region and a drain region spaced a predetermined interval apart from each other in the drift region, a field insulating layer formed in the drift region between the source region and the drain region, and a first P-TOP region formed under the field insulating layer. The LDMOS device can further include a gate polysilicon covering a portion of the field insulating layer, a gate electrode formed on the gate polysilicon, and a contact line penetrating the gate electrode, the gate polysilicon, and the field insulating layer.

6 Claims, 3 Drawing Sheets

(56) References Cited

U.S. PATENT DOCUMENTS

| | | | |
|---|---|---|---|
| 6,911,696 B2* | 6/2005 | Denison | 257/343 |
| 8,269,277 B2* | 9/2012 | Hao | 257/343 |
| 8,704,300 B1* | 4/2014 | Lin et al. | 257/335 |
| 2004/0256669 A1* | 12/2004 | Hower et al. | 257/335 |
| 2006/0170056 A1* | 8/2006 | Pan et al. | 257/365 |
| 2009/0068804 A1* | 3/2009 | Pendharkar | 438/195 |
| 2009/0258472 A1* | 10/2009 | Florian et al. | 438/424 |
| 2009/0315113 A1* | 12/2009 | Vashchenko | 257/355 |
| 2011/0140201 A1* | 6/2011 | Lin et al. | 257/342 |
| 2012/0037984 A1* | 2/2012 | Yu | 257/335 |
| 2013/0032862 A1* | 2/2013 | Su et al. | 257/272 |
| 2013/0069712 A1* | 3/2013 | Trajkovic et al. | 327/537 |
| 2013/0265102 A1* | 10/2013 | Lin et al. | 327/530 |
| 2014/0061721 A1* | 3/2014 | Chan et al. | 257/141 |
| 2014/0065781 A1* | 3/2014 | Chen et al. | 438/286 |
| 2014/0175547 A1* | 6/2014 | Chan et al. | 257/343 |
| 2014/0197466 A1* | 7/2014 | Chan et al. | 257/262 |

OTHER PUBLICATIONS

Notice of Allowance dated Aug. 8, 2014 in Korean Application No. 10-2013-0026150.

\* cited by examiner

LATERALLY DIFFUSED METAL OXIDE SEMICONDUCTOR

CROSS-REFERENCE TO RELATED APPLICATION

This application claims the benefit under 35 U.S.C. §119 of Korean Patent Application No. 10-2013-0026150, filed Mar. 12, 2013, which is hereby incorporated by reference in its entirety.

BACKGROUND

A laterally-diffused metal oxide semiconductor (LDMOS) transistor is a power device for high voltage, which has fast switching speed, high input impedance, low power consumption, and compatibility with a complementary metal oxide semiconductor (CMOS) process. Such a transistor is widely used for various power devices, including display driving integrated circuits (ICs), power converters, motor controllers, and power devices for cars. In the case of a power device, on-resistance ($R_{on}$) and breakdown voltage are important factors that have a significant impact on the performance of the device. Various techniques to maintain $R_{on}$ and increase breakdown simultaneously have been suggested.

An LDMOS device can be used as a power device to drive a light-emitting diode (LED) device. In order to do so, it should maintain high breakdown and have low $R_{on}$ simultaneously. To accomplish this, it is necessary to apply a Double Reduced Surface Field (RESULF) stacking a PTOP layer to a high voltage N WELL (HVNWELL).

FIG. 1 is a layout view of a general semiconductor device, for example, an LDMOS device. FIG. 2 is a cross-sectional view taken along line A-A' of FIG. 1 in the case of a related art power semiconductor device.

Referring to FIG. 2, a configuration of a related art LDMOS transistor includes an N-type doped deep well 2 and a P-type doped deep P well 3 in a P-type doped semiconductor substrate 1. A field insulating layer 42 having length W is formed on the surface of the N well 2, an N well 5 is formed in an open region at one side of the field insulating layer 42, and a drain region 24 doped with a high concentration N+ impurity is formed in the surface of the N well 5. A first P-TOP region 25 is formed in the deep N well 2 to form a RESULF structure.

Also, a P well 4 including inside portions of the deep P well 3 and the deep N well 2 is formed, and a second P-TOP region 12 including inside portions of the P well 4 and the deep N well 2 is formed. A source contact region 14 doped with a high concentration P+ impurity is formed in the surface of the second P-TOP region 12, and then, a source region 13 doped with a high concentration N+ impurity is formed in the second P-TOP region 12 adjacent to the source contact region 14. Then, a gate polysilicon 30 covering portions of the second P-TOP region 12 and the field insulating layer 42 is formed, and the gate polysilicon 30 is connected to an upper gate electrode 15 through wiring.

In an LDMOS device including a floating first P-TOP region of such a structure, since charges (i.e., electrons and holes) moved by an electric field are accumulated in the first P-TOP region, breakdown voltage decreases, so that it is necessary to change into a P-TOP structure that can be grounded in order to provide manufacturing process stability.

FIG. 3 is a cross-sectional view of an LDMOS device having a grounded P-TOP structure.

Referring to FIG. 3, the pitch of the first P-TOP region 25 is increased by a predetermined length, compared to that of the device shown in FIG. 2. Also, a high concentration P+ conductive connection region 18 is formed on the top surface of the increased first P-TOP region 25 to be connected to an upper ground line 19, and an extended gate polysilicon 30a and a gate electrode 15a are additionally formed.

In order to form the above structure, an additional space for expanding an existing gate poly is required. This increases a half pitch of a PTOP region and thus $R_{on}$ increases. Therefore, the operating characteristics of an LDMOS device are affected.

BRIEF SUMMARY

Embodiments of the subject invention provide a semiconductor device, and a method of fabricating the same, with a structure that maintains high breakdown voltage without increasing a pitch compared to a related art semiconductor device and allows a P-TOP region to be grounded.

In an embodiment, a laterally-diffused metal oxide semiconductor (LDMOS) device can include: a drift region; a source region and a drain region spaced a predetermined interval apart from each other in the drift region; a field insulating layer formed in the drift region between the source region and the drain region; a first P-TOP region formed under the field insulating layer; a gate polysilicon covering a portion of the field insulating layer, a gate electrode formed on the gate polysilicon; and a contact line penetrating the gate electrode, the gate polysilicon, and the field insulating layer.

In another embodiment, a method of fabricating an LDMOS device can include: forming a drift region; forming a source region and a drain region, which are spaced a predetermined interval apart from each other, in the drift region; forming a first P-TOP region by ion-implanting a second conductive high concentration impurity in the drift region; forming a field insulating layer on the first P-TOP region; forming a gate polysilicon covering a portion of the field insulating layer; forming a source electrode, a drain electrode, and a gate electrode, which are connected to the source region, the drain region, and the gate polysilicon, respectively; forming a contact line by etching the gate electrode, the gate polysilicon, and the field insulating layer; and forming a high concentration second conductive connection region in a surface of the first P-TOP region exposed to the field insulating layer after the etching process.

DETAILED DESCRIPTION

Reference will now be made in detail to the embodiments of the present disclosure, examples of which are illustrated in the accompanying drawings.

When the terms "on" or "over" are used herein, when referring to layers, regions, patterns, or structures, it is understood that the layer, region, pattern, or structure can be directly on another layer or structure, or intervening layers, regions, patterns, or structures may also be present. When the terms "under" or "below" are used herein, when referring to layers, regions, patterns, or structures, it is understood that the layer, region, pattern, or structure can be directly under the other layer or structure, or intervening layers, regions, patterns, or structures may also be present.

Figure 1:
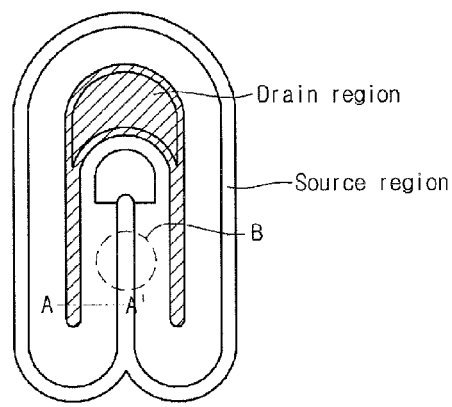
FIG. 1 is a plan view of a semiconductor device including a laterally-diffused metal oxide semiconductor (LDMOS) device.
Figure 4:
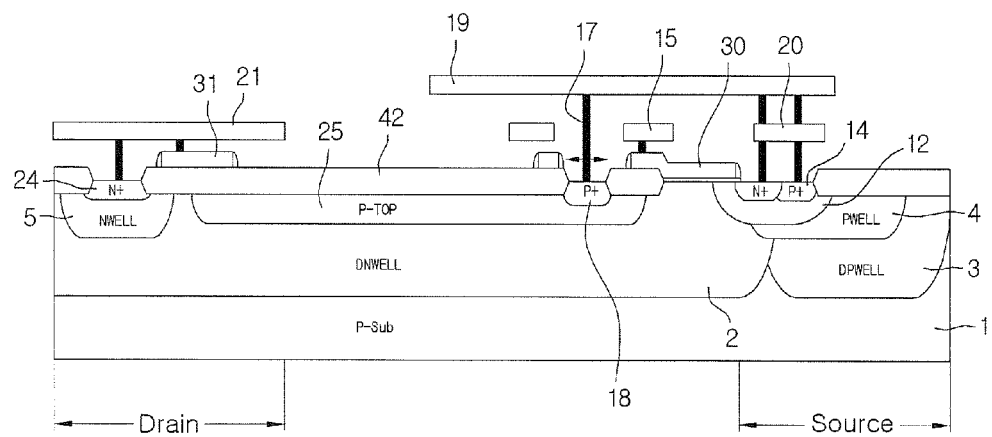
FIG. 4 is a cross-sectional view taken along line A-A' of FIG. 1 according to an embodiment of the subject invention.

FIG. 4 is a cross-sectional view taken along line A-A' of FIG. 1 according to an embodiment of the present invention.

Referring to FIG. 4, a configuration of a laterally-diffused metal oxide semiconductor (LDMOS) transistor can include an N-type doped deep well 2 and a P-type doped deep P well 3 in a P-type doped semiconductor substrate 1. Though a P-type semiconductor is shown for exemplary purposes, embodiments are not limited thereto. For example, an N-type semiconductor substrate can be used. A field insulating layer 42 can be formed on the surface of the N well 2. In an embodiment, a local oxidation of silicon (LOCOS) process can be used to form the field insulating layer 42, though embodiments are not limited thereto. An N well 5 can be formed in an open region at one side of the field insulating layer 42, and a drain region 24 (e.g., doped with a high concentration N+ impurity) can be formed in the surface of the N well 5.

A first P-TOP region 25 can be formed in the deep N well 2. Oxidation heat (e.g., during a LOCOS process for forming the field insulating layer 42) can cause the first P-TOP region 42 to diffuse below the field insulating layer 42.

A P well 4 can be formed and can include inside portions of the deep P well 3 and the deep N well 2. A second P-TOP region 12 can be formed and can include inside portions of the P well 4 and the deep N well 2. A source contact region 14 (e.g., doped with a high concentration P+ impurity) can be formed in the surface of the second P-TOP region 12, and a source region 13 (e.g., doped with a high concentration N+ impurity) can be formed in the second P-TOP region 12 adjacent to the source contact region 14. In an embodiment, the source region 13 can be formed after the source contact region 14 is formed.

The source region 13 and the drain region 24 can be separated at both sides by the field insulating layer 42. A portion adjacent to the source region 13 and overlapping a gate insulating layer and a gate polysilicon 30 in a top region of the second P-TOP region 12 can become a channel region.

In an embodiment, the gate insulating layer and the gate polysilicon 30 can be sequentially stacked on the channel region, and the source region 13 and the drain region 24 can be electrically connected to the source electrode 20 and the drain electrode 21, respectively (e.g., through wiring). The gate polysilicon 30 can be connected to the gate electrode 15 (e.g., through wiring).

The first P-TOP region 25 can be a region allowing a double reduced surface field (RESULF) effect, where electrons and holes moved by an electric field can be accumulated to reduce breakdown voltage.

Figure 2:
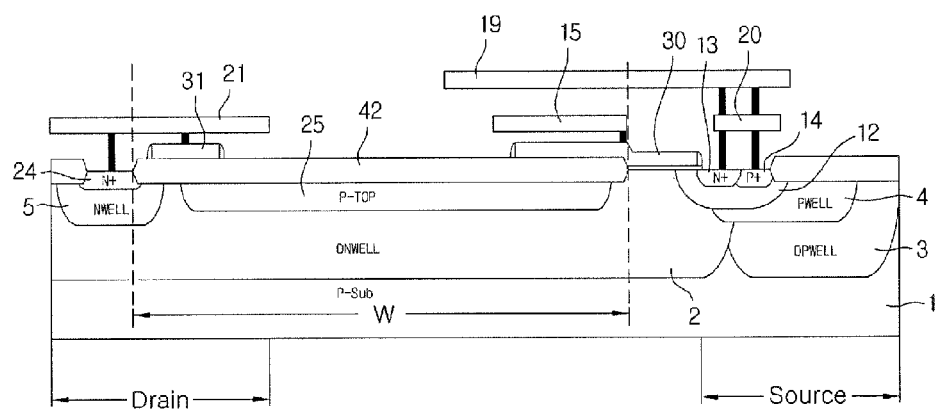
FIG. 2 is a cross-sectional view taken along line A-A' of FIG. 1 according to a related art device.
Figure 3:
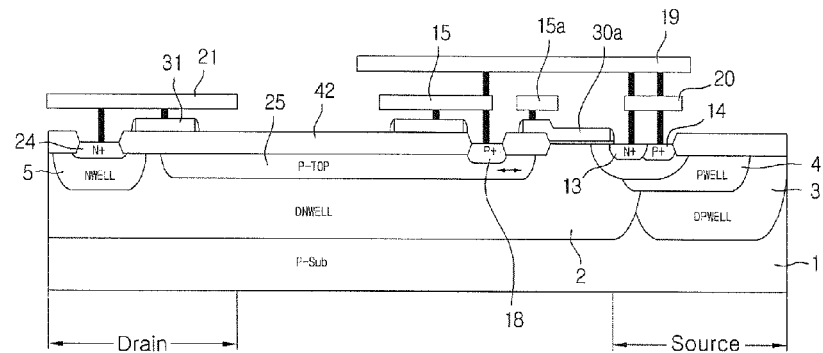
FIG. 3 is a cross-sectional view taken along line A-A' of FIG. 1 according to a related art device.

Thus, according to embodiments of the present invention, a semiconductor device can maintain high breakdown voltage and obtain manufacturing stability by grounding the first P-TOP region 25 to remove accumulated electrons or holes without increasing the length W of the field insulating layer compared to the related art LDMOS transistor shown in FIG. 2.

Referring again to FIG. 4, in an embodiment, in order to expose the first P-TOP region 42, a process for etching the field insulating layer 42, the gate polysilicon 30, and the gate electrode 15 on the top can be performed. A hard mask pattern (not shown) can be formed on the gate electrode 15, and the gate electrode 15, the gate polysilicon 30, and the field insulating layer 42 can be sequentially etched along the hard mask pattern, so as to expose the field insulating layer 42.

A contact line 17 can be formed by sequentially etching the gate electrode 15, the gate polysilicon 30, and the field insulating layer 42. The contact line 17 can penetrate the gate electrode 15, the gate polysilicon 30, and the field insulating layer 42. A high concentration second conductive connection region 18 (e.g., doped with a high concentration of impurities of a second conducive type) can be formed on the exposed surface of the first P-TOP region 25. The high concentration second conductive connection region 18 can be formed after the contact line is formed. The high concentration second conductive connection region 18 can be connected to a ground line 19 through the exposed contact line 17 to be grounded. The specific form of the contact line 17 shown in FIG. 4 is for exemplary purposes, and embodiments are not limited thereto.

Figure 5:
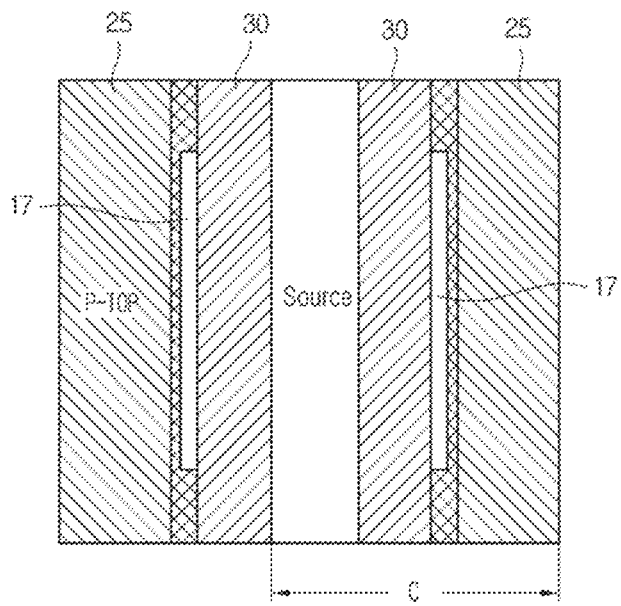
FIG. 5 is a plan view of region B of FIG. 1 according to an embodiment of the subject invention.

FIG. 5 is a plan view illustrating a layout of region B in the semiconductor device of FIG. 1.

Referring to FIG. 5, first P-TOP regions 25 can be symmetric to each other based on a source region. A bar type contact line 17 can be formed in a gate polysilicon 30 covering one side of the first P-TOP region 25.

The contact line 17 can be obtained by etching a region where the field insulating layer 42 and the gate polysilicon 30 are stacked together, and can be formed with various layouts during a process for forming a hard mask pattern.

Figure 6:
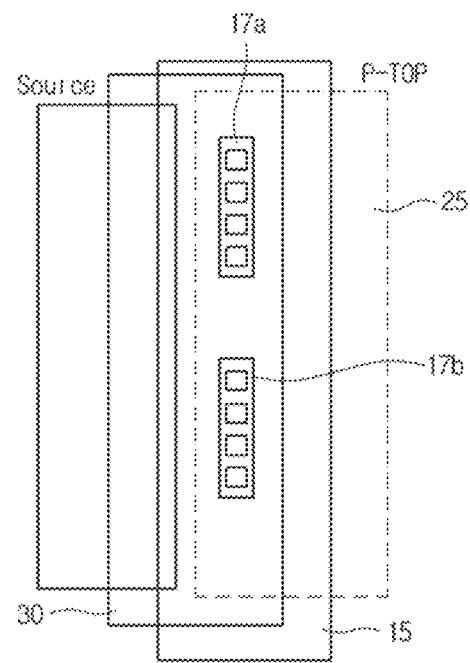
FIG. 6 is a plan view of region C of FIG. 5.

FIG. 6 is a plan view of region C of FIG. 5.

Referring to FIG. 6, the first P-TOP region 25, the field insulating layer 42, the gate polysilicon 30, the gate electrode 18, and a source region can be stacked. In an embodiment, the high concentration second conductive connection region 18 in the first P-TOP region 25 can be formed by etching the field insulating layer 42 having the gate polysilicon 30.

The high concentration second conductive connection region 18 can be connected to a wire through a contact line. The wire can be connected to an upper ground line to form a structure in which the first P-TOP region 25 is grounded. In an embodiment, the form of the contact line 17 can include bar type regions 17a and 17b, and each bar type region 17a and 17b can include a plurality of wires. Though such a configuration is shown for exemplary purposes, embodiments are not limited thereto. For example, each contact line for one wire connection can be formed. That is, the contact line 17 can be formed with a plurality of hole types.

Though components have been described as P-type, N-type, N+, and P+, embodiments are not limited thereto. For example, each N well or deep N well can be P well or deep P well, respectively, and vice versa.

According to embodiments of the present invention, an LDMOS device can be manufactured such that a P-TOP region is grounded without an additional process and without increasing the pitch of a semiconductor device.

Additionally, due to no increase of a pitch of a semiconductor device, the LDMOS device can be used for a power device, maintaining high breakdown voltage without increasing on-resistance ($R_{on}$).

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

What is claimed is:

1. A laterally-diffused metal oxide semiconductor (LDMOS) device, comprising:
    a drift region;
    a source region and a drain region spaced a predetermined interval apart from each other in the drift region;
    a field insulating layer formed in the drift region between the source region and the drain region;
    a first P-TOP region formed under the field insulating layer;
    a gate polysilicon covering a portion of the field insulating layer;
    a gate electrode formed on the gate polysilicon;
    a contact line penetrating the gate electrode, the gate polysilicon, and the field insulating layer; and
    a high concentration second conductive first connection region formed in the first P-TOP region, wherein the high concentration second conductive first connection region is connected to a ground line to allow the first P-TOP region to be grounded.

2. The LDMOS device according to claim 1, wherein the source region comprises a second P-TOP region into which a P-type high concentration impurity is ion-implanted.

3. The LDMOS device according to claim 1, further comprising a ground line formed on the gate electrode.

4. The LDMOS device according to claim 1, wherein the contact line is connected to an upper ground line.

5. The LDMOS device according to claim 1, wherein the contact line comprises a plurality of continuous bar-type contact lines.

6. The LDMOS device according to claim 5, wherein each of the bar-type contact lines comprises a plurality of hole types.

* * * * *